United States Patent
Leddige et al.

(10) Patent No.: US 7,772,708 B2
(45) Date of Patent: Aug. 10, 2010

(54) STACKING INTEGRATED CIRCUIT DIES

(75) Inventors: Michael Leddige, Beaverton, OR (US); James A. McCall, Beaverton, OR (US); Ajit Deosthali, Portland, OR (US); Brad Larson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 710 days.

(21) Appl. No.: 11/513,994

(22) Filed: Aug. 31, 2006

(65) Prior Publication Data

US 2008/0054493 A1 Mar. 6, 2008

(51) Int. Cl.
*H01L 23/48* (2006.01)
*H01L 21/44* (2006.01)

(52) U.S. Cl. .............................. 257/786; 257/E23.069; 257/E23.079; 257/E25.013; 257/686; 257/723; 257/777; 257/737; 257/738; 257/734; 257/778

(58) Field of Classification Search ................. 257/786, 257/E23.069, E25.013, E23.079, 686, 723, 257/777, 737, 738, 734, 778; 438/666
See application file for complete search history.

(56) References Cited

U.S. PATENT DOCUMENTS

| | | | |
|---|---|---|---|
| 6,414,381 B1 | 7/2002 | Takeda | |
| 7,071,420 B2 | 7/2006 | Chambers | |
| 7,347,701 B2 * | 3/2008 | Daly et al. | 439/70 |
| 2005/0221532 A1 * | 10/2005 | Chee | 438/106 |
| 2006/0087020 A1 * | 4/2006 | Hirano et al. | 257/686 |
| 2006/0157842 A1 | 7/2006 | Goodwin | |
| 2006/0175693 A1 | 8/2006 | Cady et al. | |
| 2006/0208348 A1 * | 9/2006 | Ohsaka et al. | 257/685 |
| 2006/0255446 A1 | 11/2006 | Wehrly | |
| 2007/0152313 A1 * | 7/2007 | Periaman et al. | 257/686 |
| 2008/0010625 A1 * | 1/2008 | Bittner et al. | 716/12 |
| 2009/0065937 A1 * | 3/2009 | Lin et al. | 257/738 |

\* cited by examiner

*Primary Examiner*—Alexander O Williams
(74) *Attorney, Agent, or Firm*—Schubert Osterrieder & Nickelson PLLC; Jeffrey Schubert

(57) ABSTRACT

A stackable die mounting system with an efficient interconnect is disclosed that can have a base chip carrier to interconnect a base integrated circuit die to a circuit board on a first side and to a second stacked integrated circuit on a second side. The second side can include a first region having a pad out configuration of a first input output (I/O) to transmit data to be stored by the stacked integrated circuit die. The base chip carrier can have a second region with a pad out of a second I/O that is configured to receive data transmitted by the stacked integrated circuit die wherein the pad out of the second port is translated and rotated about an axis from the pad out of the first region such that a busses with different functions can be vertically integrated from the circuit board.

6 Claims, 3 Drawing Sheets

STACKING INTEGRATED CIRCUIT DIES

FIELD

The present disclosure relates to integrated circuits. More particularly, embodiments of the present disclosure are in the field of interconnecting and securing integrated circuits.

BACKGROUND

Generally, new developments in technology allow electronic devices to provide increased functionally in smaller packages. For example, digital cameras, camera phones, movie picture experts group layer three (MP3) complaint audio devices, IPODs®, miniature personal computers, and movie cameras are ever increasing in features and ever decreasing in size. The electronic devices listed above, generally require a significant amount of memory, and thus typically require a significant number of memory integrated circuits (IC)s or memory chips to operate. Accordingly, incorporating a larger number of ICs into smaller packages continues to be a design goal for many.

Packaging and interconnecting a large number of ICs within a sophisticated, high density electronic device, such as a camera phone presents many different design challenges. Such design challenges include electrically interconnecting the ICs in tight spaces, allowing for adequate cooling of the ICs, and ensuring that vibration and thermal expansion of the ICs due to heating does not break or fracture the electrical interconnections between the IC die.

Advances in technology, and in manufacturing equipment have allowed ICs to become physically larger in size. Generally, the larger the IC, the more functions and features the IC can provide. However, there is a practical, and/or economic limit to the maximum size of an IC.

For example, as the die on which the IC gets manufactured gets larger, the reliability or yield of each batch of ICs on each wafer can significantly decrease. Second, semiconductor manufacturing equipment often has limitations regarding the maximum size of the die that can be cut from a wafer and handled during the manufacturing and testing process. Third, testing and assembling large die requires specialized manufacturing and testing equipment. Thus, for physically larger ICs, not only is the number of ICs that can be manufactured on wafer reduced, but the yield from each wafer can be greatly reduced because larger die often have additional reliability problems. Low yields greatly increase the cost of individual ICs, because the cost to manufacture the wafer must be allocated to the few acceptable IC devices produced. Because larger die are generally much more expensive, designers continue to work on ways to efficiently interconnect several smaller ICs.

Thus, in order for electronic devices to be small, achieve the desired functionality, and be economical to build, designers commonly utilize smaller ICs and tightly or efficiently package the IC's on circuit boards within the device. Even relatively small ICs have hundreds of conductive pads that must be electrically interconnected to the circuit board such that the IC die can receive power and ground and can receive a plurality of signals from other ICs. It can be appreciated that efficiently and reliably interconnecting hundreds of pads between multiple ICs in a small package can be a complex process. Many vendors stack ICs horizontally or in a parallel configuration with the mounting circuit board and with other ICs. For example, it is common for a state-of-the-art device to have four ICs stacked on top of each other in various locations on a circuit board. Often, in such a configuration multiple individual ribbon cables are looped from IC to IC to interconnect the ICs. A stack of four IC die often requires precision assemble of six or more individual cables.

Interconnecting stacked IC creates many design challenges. For example impedance matching of conductors, robust solder connections, mechanical retention of the ICs, and efficient assembly of these IC packages are all important considerations. More particularly, it is tedious task to make electrical connections from virtually "microscopic" pads on an IC die to other ICs.

As stated above, in most electronic devices there is an ever increasing need for processing and memory capacity and most new devices require a significant number of memory ICs. Generally, memory systems can require redundant busses and thus, the routing density of conductors between ICs becomes a significant challenge particularly with such tight space requirements. The current designs can require twice the routing density than designs from previous generations. Most designers find it very challenging to efficiently and reliably assemble and interconnect so many IC in such limited space and provide compact impedance matched routing for the electrical signals.

DETAILED DESCRIPTION OF EMBODIMENTS

Figure 1:
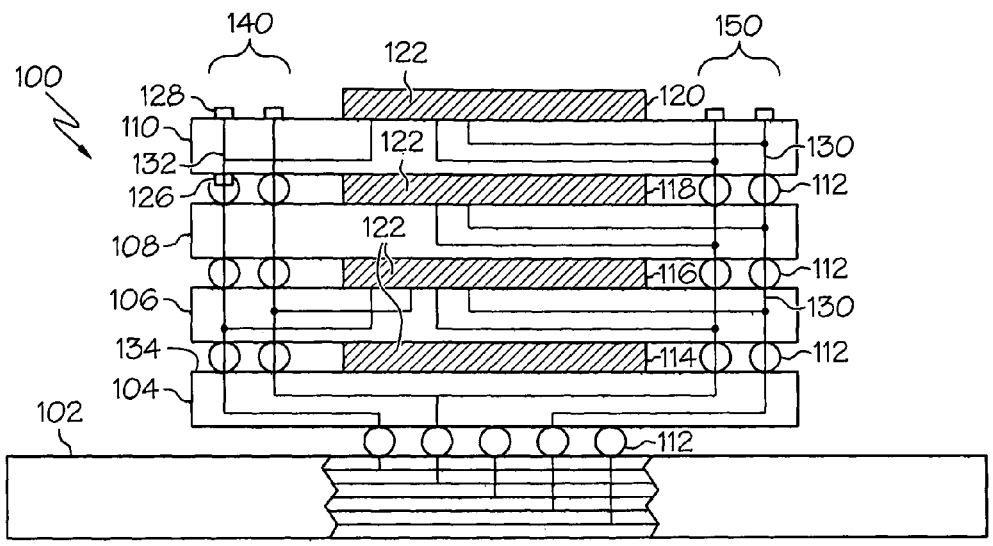
FIG. 1 depicts an embodiment of integrated circuit and chip carriers stacked onto a circuit board utilizing a ball grid array.

The following is a detailed description of embodiments of the disclosure depicted in the accompanying drawings. The embodiments are introduced in such detail as to clearly communicate the disclosure. However, the embodiment(s) presented herein are merely illustrative, and are not intended to limit the anticipated variations of such embodiments; on the contrary, the disclosure is to cover all modifications, equivalents, and alternatives falling within the spirit and scope of the appended claims. The detailed descriptions below are designed to make such embodiments obvious to those of ordinary skill in the art.

The present disclosure and some of its features have been described in detail for some embodiments. It should be understood that various changes, substitutions and alterations can be made herein without departing from the spirit and scope of the disclosure as defined by the appended claims. An embodiment of the disclosure may achieve multiple objectives, but not every embodiment falling within the scope of the attached claims will achieve every objective. Moreover, the scope of the present application, is not intended to be limited to the particular embodiments of the process, machine, manufacture, composition of matter, means, methods and steps described in the specification.

One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

Many electronic devices require a significant amount of integrated circuits (IC)s including memory ICs. However, placing numerous memory ICs directly to a circuit board can require a relatively large amount of circuit board area. Such a large circuit board area is often not available in small handheld electronic devices. Thus, stacking of ICs on top of each other is one option for increasing the density of ICs in small devices. Also, stacking of ICs can provide additional benefits, for example, stacking IC can provide shorter impedance matched conductors between ICs and this allows for faster clock speeds and thus faster processing. However, such a configuration typically requires complex routing strategies for conductors between ICs in a stack.

Accordingly, a stackable die mounting system with an efficient space saving interconnect is disclosed herein. In one embodiment of the present disclosure, a stackable apparatus having a base chip carrier to interconnect a circuit board to stacked IC chip carriers is described herein. The base chip carrier can be configured to interface the circuit board on a first side and configured to interface a pad out of a stacked chip carrier on a second side. The base chip carrier and the stacked chip carriers can both secure and electrically connect functionally identical ICs. The second side of the base chip carrier can include a first region having a pad out configuration of a first port of the base IC to convey data to a different port or secondary port of the stacked IC. The second side of the base IC can also have a second region that has a pad out configuration of a secondary bus of the base IC, such that the base IC can receive data from the primary bus of the stacked IC. The pad configurations are made such that vertical columns of solder can interconnect the busses between the chip carriers.

The present disclosure achieves a vertical bus or a bus configured as a column of solder connections that eliminates "crisscrossing" or horizontal runs and the need for cabling between stacked chip carriers. The pad out of the second port of a stacked chip carrier can be a translated and rotated version of the pad out of the first region such that busses from different chip carriers with different functions can be fabricated perpendicular to, and rise from the surface of the circuit board. Additional ICs in chip carriers can be vertically integrated on the stack of ICs to provide additional processing power and/or memory without requiring/utilizing additional circuit board area.

In yet another embodiment, a method for stacking ICs is disclosed. The method can include creating a first chip carrier and creating a second chip carrier where the first and the second chip carrier have a first side and a second side. The first side of the second chip carrier can have an electrode interconnect configuration and the second side of the second chip carrier can have an electrode configuration that is a transposed version of the electrode configuration of the first side such that all of the stacked chip carriers can have the same pin out to allow a "vertically" fabricated bus.

To interconnect the busses the second chip carrier can be rotated one hundred eighty degrees from a position of the first chip carrier such that the functional pin outs of the first chip carrier and the second chip carrier align and the second chip carrier can be stacked on the first chip carrier proximate to the second side of the first chip carrier. The first side of the first chip carrier can be connected to the second side of the second chip carrier such that functionally different busses on the first and second chip carrier can interconnect vertically.

Referring to FIG. 1, a stacked die apparatus 100 is disclosed. The apparatus 100 can include a printed circuit board 102, a base chip carrier 104, and stacked chip carriers 106, 108 and 110, referred to herein generally as chip carriers (104-110). Chip carriers 104-110 can mount IC dies 114, 116, 118, and 120, referred to collectively as ICs 122, that are functionally equivalent or are manufactured from the same wafer. The chip carriers 104-110 can function as die mounting and interconnect assemblies for the ICs 122. Although base chip carrier 104 is illustrated as having a different pad out or electrode configuration on the side that is proximate to the printed circuit board 102 than the side that faces the chip carriers 104-110, the base chip carrier 104 could have an identical pad out on both sides (i.e. top and bottom), without parting from the scope of the present disclosure. Likewise, although FIG. 1 depicts a solder ball grid array embodiment to interconnect pads on the chip carriers 104-110, chip carriers with pins or with other mounting technology would not part from the scope of this disclosure.

Base chip carrier 104 and stacked carriers 106-110 may contain analog, digital or hybrid circuits for example a microprocessor, a microcontroller, an application specific IC, a static or dynamic memory devices, a radio frequency processing devices or any other know type of IC. Many different attachment methods or topologies could also be utilized to interconnect the base package 104 with the stacked package 106-110. For example, a ball grid array, a fine ball grid array, chip scale packages, thin quad flat packs, or any other interconnect topology could be utilized to interconnect the chip carriers 104-110.

Base chip carrier 104 and chip carriers 106-110 can be organic chip carriers. A typical organic chip carrier is built with resin based materials such as Bismalemide triazine (BT), "Driclad™" or flame resistant type 4 (FR4) epoxy with layers of copper conductors embedded in the resin material. The BT and Driclad carriers can utilize plated through hole or vias such as via 132 to make layer to layer connections of conductors in the chip carrier (not shown) and to connect electrodes or pad on the top side of the chip carriers 104-110 to electrode(s) on the bottom side of the chip carriers 104-110. For example, via 132 can interconnect the pad 126 on the bottom of the chip carrier 110 to the pad 128 on the top side of the chip carrier 110. All chip carriers 104-110 can have this feature to create the vertical bus interconnection.

In one embodiment, the chip carriers can utilize a Surface Laminar Circuit™ to interconnect the ICs 122 to the chip carriers 104-110. A Surface Laminar Circuit can provide a high-density of copper traces and pads on the surface layer of the chip carriers 104-110. This pad out density may be increased by substituting micro vias for the plated throughhole vias. This can reduce the surface area required on a circuit board two or three times that is needed to connect a chip carrier allowing finer lines and spaces to be utilized to interconnect the chip carriers.

FIG. 1 is not drawn to scale and the organic chip carriers 104-110 can achieve pad outs exceeding 1,000 pads per chip carrier 104-110. Pads, pins, solder balls or any other electrical interconnection point on the chip carriers 104-110 are referred to generically herein as electrodes. The electrodes on the surfaces of the chip carriers 104-110 can be connected to internal conductive layers of the chip carriers 104-110, the ICs 122, and various vias in the chip carriers 104-110.

The ICs 122 can be placed into or onto the chip carriers 104-110 and mechanically secured to the chip carriers 104-110 with an epoxy. The electrodes of the ICs 122 mounted in the chip carriers 104-110 can be attached to the copper traces and vias in the chip carriers 104-110 by fine (small diameter) gold wires with bond pad pitch spacings possibly less than 60 microns on center.

To stack the chip carriers 106-110 on top of each other a "flip-chip" manufacturing technology could be utilized. Flip chip technology utilizes a surface mount technology where an IC 122 is packaged in place on the circuit board 102 and then underfilled with an epoxy. A common technique for attachment is to place solder balls on the chip, and "flip" the chip over onto the board or chip carrier and melt the solder, hence the name flip chip.

When chip carriers 104-110 are utilized the vias such as via 130 and 132 can interconnect pads to internal traces in the chip carriers 104-110 and during manufacturing solder balls 112 can be manufactured or created between pads of adjacent chip carriers to electrically and mechanically interconnect the chip carriers 104-110. Vias such as via 132 can transfer an electrical signal from a pad on the bottom side of the chip carrier 110 to a pad on the top side of the chip carrier 110.

All of the ICs 122 in the stack can be made form the same wafer, and can therefore have functionally equivalent operation with the same input stimuli. This reduces the cost of the product because higher usage of identical parts and elimination of a low volume IC provides substantial savings. Thus, in one embodiment where a star or fan out repeater to non-repeater interconnect configuration is desired, the base IC would be connected differently internal to the chip carrier and have a different pad out than the other chip carriers (i.e. 106-110). The base package can function as a repeater and retransmit a received signal to the stacked packages. The stacked packages can be utilized for redundant storage, and all stacked packages can store a copy of what the repeater transmits to them. In this fan out/repeater embodiment, with a vertical memory system interconnect, the internal interconnect of the stacked chip carriers 106-110 can be identical and the base chip carrier can be wired differently. The base chip carrier 104 will perform the repeater function because it is interconnected differently and the ICs in the other chip carriers 106-110 may perform a similar or identical function of storing the same data in the same location of the IC.

Thus, a single output bus of the base chip carrier 104 could feed each input bus of the stacked ICs in chip carriers 106-110. To efficiently achieve this, the base die mounting assembly 104 can have an electrode interconnect configuration divided into two regions 140 and 150 with electrodes supporting a first bus in the first region 140 and electrodes supporting a second bus in a second region 150. The chip carrier 106 can have a bottom side with an electrode interconnect configuration with a first and second region 140 and 150 that has a pad out that physically mates with the first and second region 140 and 150 of the base chip carrier 104.

The first region 140 can support the first bus and the second region 150 of the chip carriers 104-110 can support the second bus. Thus, the busses can be configured in the pad outs of the chip carriers 104-110 such that the solder balls that hold the stacked chip carriers 104-110 can be fabricated substantially perpendicular to, or vertically from the circuit board 102 to interconnect a first bus driven by the bottom chip carrier 104 to receiving busses of the rest of the stacked chip carriers 106-110.

The interconnect between the base IC and the stacked IC via the pad outs of the base chip carrier 104 and the stacked chip carrier 106 can be accomplished by dividing the pad out into regions. For example, the pad out could be divided into two, four, six, eight or more regions. In these regions the pad outs can be transposed, inverted and/or rotated such that a first bus of the base IC interconnects with the second bus of all stacked ICs. To describe this manipulation of the pad out in the quadrants when assembling the chip carrier 106 to the base die mounting assembly 104, the chip carrier 106 can be rotated one hundred eighty degrees in relation to the base die mounting assembly 104 to superimpose regions of the base carrier 104 onto different regions on chip carrier 106. This allows functionally identical ICs with a translated and rotated pad out to cross-connect busses while maintaining an efficient vertical interconnect configuration in the stack. In the redundant memory configuration a primary bus of the base die mounting assembly 104 can interconnect with a secondary bus of the chip carriers 106-110 and the secondary bus of the base die mounting assembly 104 can interconnect with the primary buses of the chip carriers 106-110.

The base chip carrier 104 can have a specific electrode interconnect configuration or pad out on its top side 134, and chip carrier 106 can have a bottom side electrode interconnect configuration to mate with the electrode configuration on the top side 134 of the base chip carrier 104. The pad out configuration on the top side of chip carrier 106 can be a transposed version of the pad out on the bottom side of the chip carrier 106 such that other chips with the same or similar pad outs can be stacked on top of the chip carrier 106 to achieve a vertical interconnection of conductors on a bus.

Such a vertical structure can provide a fan out bus topology such that all input busses of the chip carriers 106-110 and the corresponding ICs 122 can receive the same signal from a single output bus of the IC in the base chip carrier 104. Thus, the pad out and vias from the bottom surface of a chip carriers 106 to the top surface of chip carrier 110 can provide a vertical interconnect. Generally, the pad out on the top side a chip carrier (i.e. 106-110) is a vertically translated version of the electrode configuration on the bottom side of the chip carriers 106-110.

Figure 2:
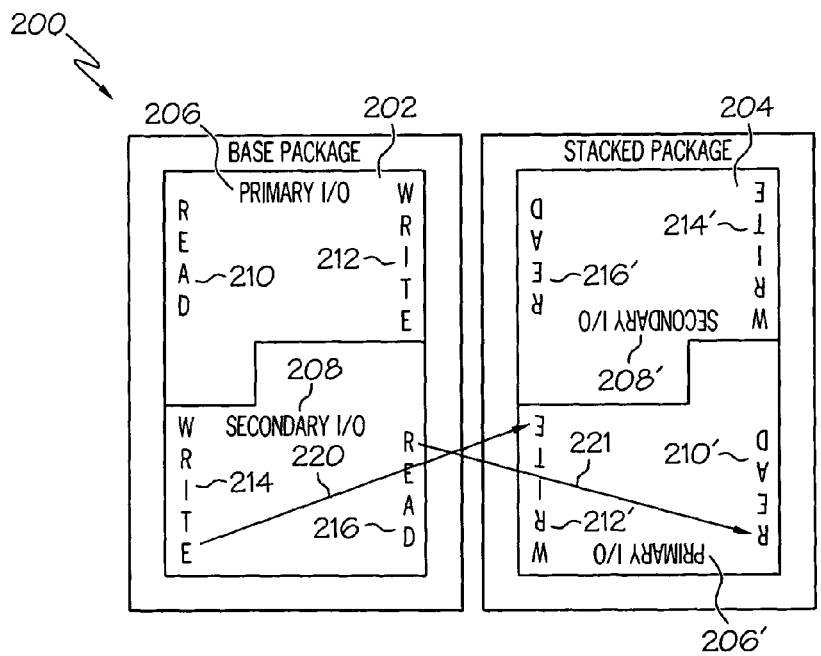
FIG. 2 illustrates an embodiment of a general arrangement of pad outs of two stackable chip carriers.

Referring to FIG. 2 a general layout 200 of a base package 202 and a stacked package 204 is illustrated to assist in describing the transposition and rotation of the electrode interconnect configuration disclosed above to create vertical busses to interconnect the ICs 122. In one embodiment it is desirable to interconnect the secondary input output (I/O) or port 208 of the base package 202 to the primary port 210' of the stacked package 204. Thus, the pad out of the base package 202 and the pad out of the staked package 204 can be divided into two regions possibly a first bus and a second bus or a primary I/O and a secondary I/O.

Although the base package 202 and the stacked package 204 are drawn side-by-side this is done for explanation purposes and when they are fabricated they would be placed in a vertical configuration or the stacked package 204 would be stacked on, or superimposed on the base package 202. The pads on the stacked package 204 (not shown) can be placed such that the busses can run at a right angle or perpendicular to the circuit board mounting the base package (not shown). With the one hundred eighty degree rotation of identical pad outs, crossing of bus conductors is still required and solder balls could not be utilized to interconnect the busses because they would not be vertical. This cross-over or horizontal interconnection, illustrated by lines 220 and 221 that point from the top to bottom of the read and write ports 212' 206' 214 and 216 illustrates that not only would a rotation of the chip carrier be required but an inversion of the individual busses in one of the regions would be required for a purely vertical integration to take place.

The stacked package 204 can have the same two region electrode configuration as the based package 202, where the electrode configuration of the stacked package 204 is rotated one hundred eighty degrees, or on paper "turned-upside-down" in relationship to the base package 202 and each region can be inverted or transposed. The primary input-output (I/0) 206 of the base package corresponds to the primary I/O 206' for the stacked package 204. Accordingly, the print on the stacked package 204 is configured rotated one hundred eighty degrees or "upside down" to illustrate how the stacked package 204 can be rotated and the pins designated by the words "read" and "write" are inverted on the illustrated stacked package 204 to show how without rotating the pin outs across an axis busses would have to cross between the packages (202 and 204). Thus, the pin outs of the ports of the stacked package 204 can be inverted from what is shown by the text read and write in FIG. 2 to eliminate the requirement to cross connect or provide horizontal connections and busses that physically run outside the edges of the chip carriers. Thus, primary I/O read 210 and write 212 corresponds to primary I/O read prime 210' and primary I/O write prime 212' and secondary I/O read 216 and write 214 corresponds to secondary read prime 216' and secondary write prime 214'.

As stated above, in one embodiment the base package 202 and the stacked package 204 could be memory chips in a fan out/repeater based memory system where the primary read input 210 of the base package 202 receives input from a printed circuit board (not shown) and selectively provides outputs on a secondary output write port 214 to the primary input read 210' of the stacked package 204. Other stacked packages could then be stacked on the stacked package 204 to create a stack of IC carriers four or five high. The base package 202 can function as a repeater because it can retransmit a received signal to the stacked package 204 and other stacked packages (not shown). The stacked packages can be utilized for redundant storage, and all stacked packages can store a copy of what the repeater transmits to them. Thus, a repeater package can receive an input, and transmit a signal representing this input to a plurality of other non-repeater packages in the stack. When requested by a memory controller the non-repeater packages (such as chip carriers 106-110 in FIG. 1) can store data and send the data back from their primary output write port 212' to the secondary write port 214 of the base package 202.

Thus, in one embodiment it is advantageous to interconnect stacked IC dies with packages (such as package 204) that have electrode configurations that are substantially "identical" such that a vertical bus interconnect can be achieved that eliminates a complex crossing of conductors between the stacked packages. This vertical interconnect structure can reduce the cost of the assembly when compared to interposer cables and other cable type structures that must convey signals in three dimensions such as horizontally, vertically and laterally in a stack of chip carriers. When a primary port can be connected to a secondary port in a vertical interconnection much of the fabrication process can be automated eliminating much human effort and specialty interconnect parts.

With the appropriate interconnect within the chip carriers 104-110, the stacked packages such as stacked package 204 can be rotated and the pad outs of the regions can be inverter such that the appropriate pins of primary ports 210' and 212' can be proximate to, and vertically integrated utilizing a solder ball to secondary ports 216 and 214 respectively.

To accomplish such a base/repeater package that supplies numerous stacked packages, with the same data, a "fan out" or "star" interconnect topology can be utilized. The rotation of the stacked packages and inversion of pins in each quadrant, allows the busses of the base package 202 to be fanned out utilizing a minimum amount of interconnect structure. Thus, a "stacked star" topology can be created by utilizing two different chip carrier pad out configurations.

Other stacked interconnect topologies could be provided for other data storage or data processing methodologies, sequences or process. For example, each memory chip can have separate input ports and separate output ports or dedicated input ports and dedicated input ports that transmit data to and receive data from a single location. For example, the base die 202 can receive data from the memory controller (not shown) on its primary input port, store the data and provide a repeat transmission of the stored data on multiple output ports, sending the data to all stacked packages on separate conductors. This may require additional ports and pad outs to those shown in the figures.

Thus, the stacked interconnect can support either a star topology with one sender and multiple receivers, or the interconnect could be configured in a daisy chain where a single transmit port can send data to a single receive port. Such an interconnect configuration may require multiple links via the solder balls or other interconnect structures to provide data to IC at the top of stack. For example, the data may take three different conductors, transmitters and receivers to provide data to the top of a stack with four ICs. In a daisy chain configuration, the ICs may not share busses but each bus on each chip can be interconnected by dedicated conductors.

The base package 202 can also send the stored data directly back to the controller on its primary output port in response to a request from the memory controller. Thus, all of the memory ICs that are in the stack can receive and store identical data and different stacked chips can individually send their data to different locations. This configuration also requires significant routing density and a complex routing structure particularly when a vertical interconnect structure is not utilized. However, the disclosed stacked configuration with redundant vertical output busses can accommodate such routing density efficiently even without an interconnecting cable between chip carriers.

Notwithstanding the higher routing density achieved by the primary port to secondary port interchange, all of the ICs in a stack can be manufactured from the same batch and can be functionally equivalent to increase the volume of identical IC dies that can be utilized in a device. As discussed above, data to be stored in packages within the stack can be received by the base package 202 from a circuit board on a primary input read 210 and a secondary write port 214 can transmit data to all ICs in the stack. The repeater function of the base package can provide identical data on output secondary write port 214 to all non-repeater ICs such as the stacked package 204 and all non-repeater stacked package can receive the repeated or duplicate data on a secondary input write port 212'. Thus, stacked packages can store identical redundant data. This fan out memory design can be utilized in a high performance/high speed system because lower capacitances and currents can be achieved over the data bus with the vertical fan out interconnect provided. When requested, all or some of the stacked package can provide their stored data on a secondary output port such as secondary write ports 214'. The chip carriers can have specific impedances to provide a robust low loss connection between the dies and the circuit board.

Figure 3:
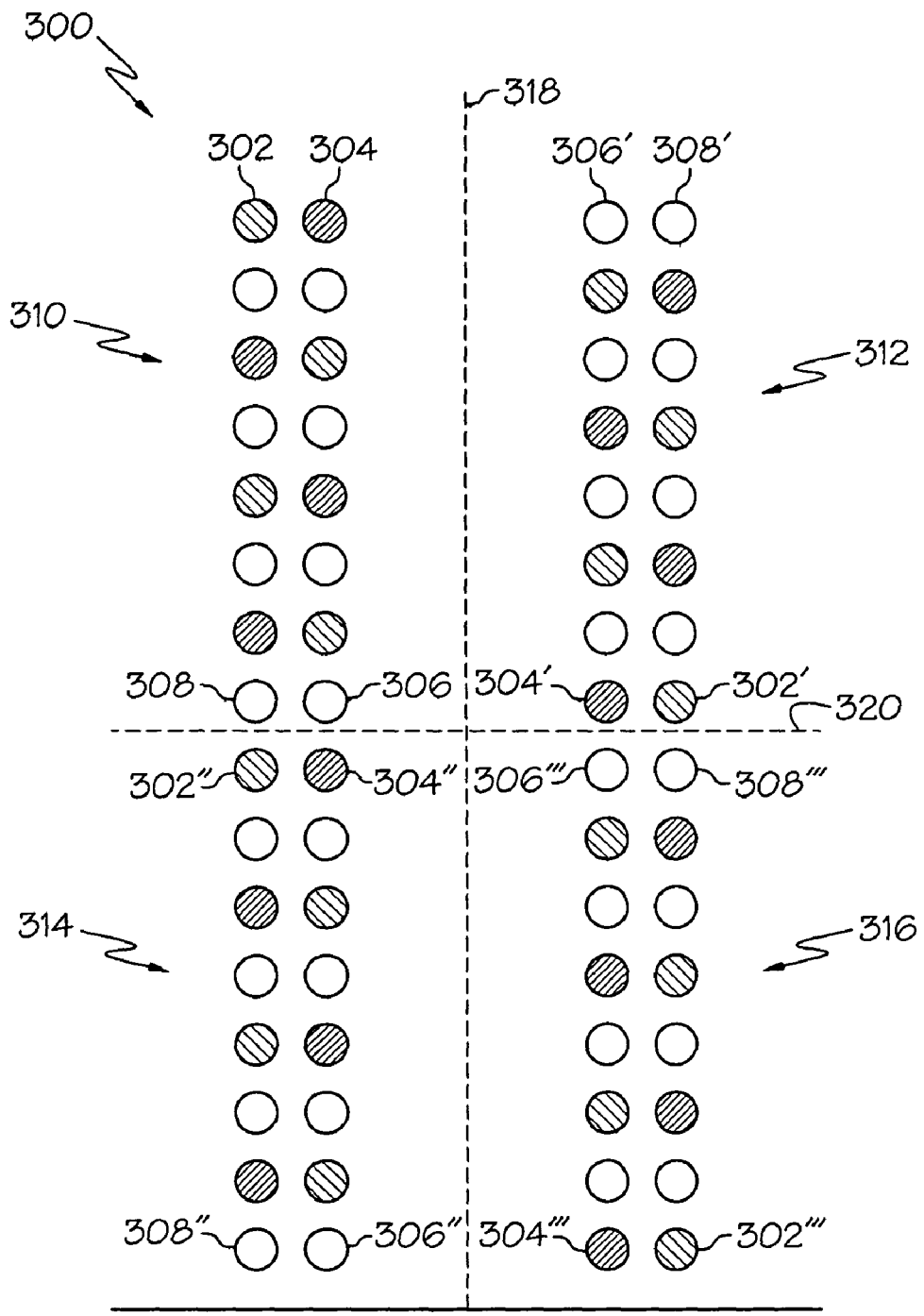
FIG. 3 depicts a more detailed arrangement of a possible pad out of a stackable integrated circuit die.

Referring to FIG. 3, a pin out is provided that can eliminate the crossing or horizontal cross over of conductors to provide a purely vertical interconnect. For simplicity, a four column, four row electrode configuration is illustrated; however, any number of rows and columns would not part from the scope of the present disclosure. The electrode configuration can be divided into regions such as a first region 310, a second region 312, a third region 314 and a fourth region 316.

The quadrants can be divided by an X axis 320, and a Y axis 318. The first quadrant 310 in FIG. 3 can represent a pad out of the primary read port 210 of FIG. 2, the second quadrant 312 can represent a pad out of the primary write port 212 of FIG. 2, the third quadrant 314 can represent a pad out of the secondary write port 214 and the fourth quadrant 316 can represent a pad out the secondary read port 216. In the description of FIG. 2 regarding translating the pad outs, FIG. 3 will provide a different description of how the pad outs can be rotated, inverted, and translated to achieve a vertical interconnect that connects a first bus of a base chip package to a second bus of a stacked package in a structure perpendicular to a mounting circuit board.

The bus in first region 310 can have border pins 302, 304 306 and 308 and a plurality of pins in between the border pins that do not change in order or sequence. Border pins 302' 304' 306' and 308' of the second region 312 can be inverter in relation to the bus layout in the first region as illustrated. The prime marking can indicate a functionally similar pin for a different bus. For example, a first data line of a sixteen bit bus. Also, some of the conductors illustrated can be powers, grounds and control lines.

The third region 314 border pins 302", 304" 306" and 308 are transposed in relation to the border pins 302, 304, 306 and 308 of the first region. Likewise border pins 302'" 304'" 306'" and 308'" are rotated about the X axis and translated in relation to the bus or port pad out of the first region. FIG. 3 illustrates how the bus pad out or electrode configuration can be translated and inverter in relation in different quadrants to interconnect busses from one chip carrier to another chip carrier. Rotating all four regions and inverting the pad outs in the individual regions can provide the desired vertical interconnect of different busses.

Figure 4:
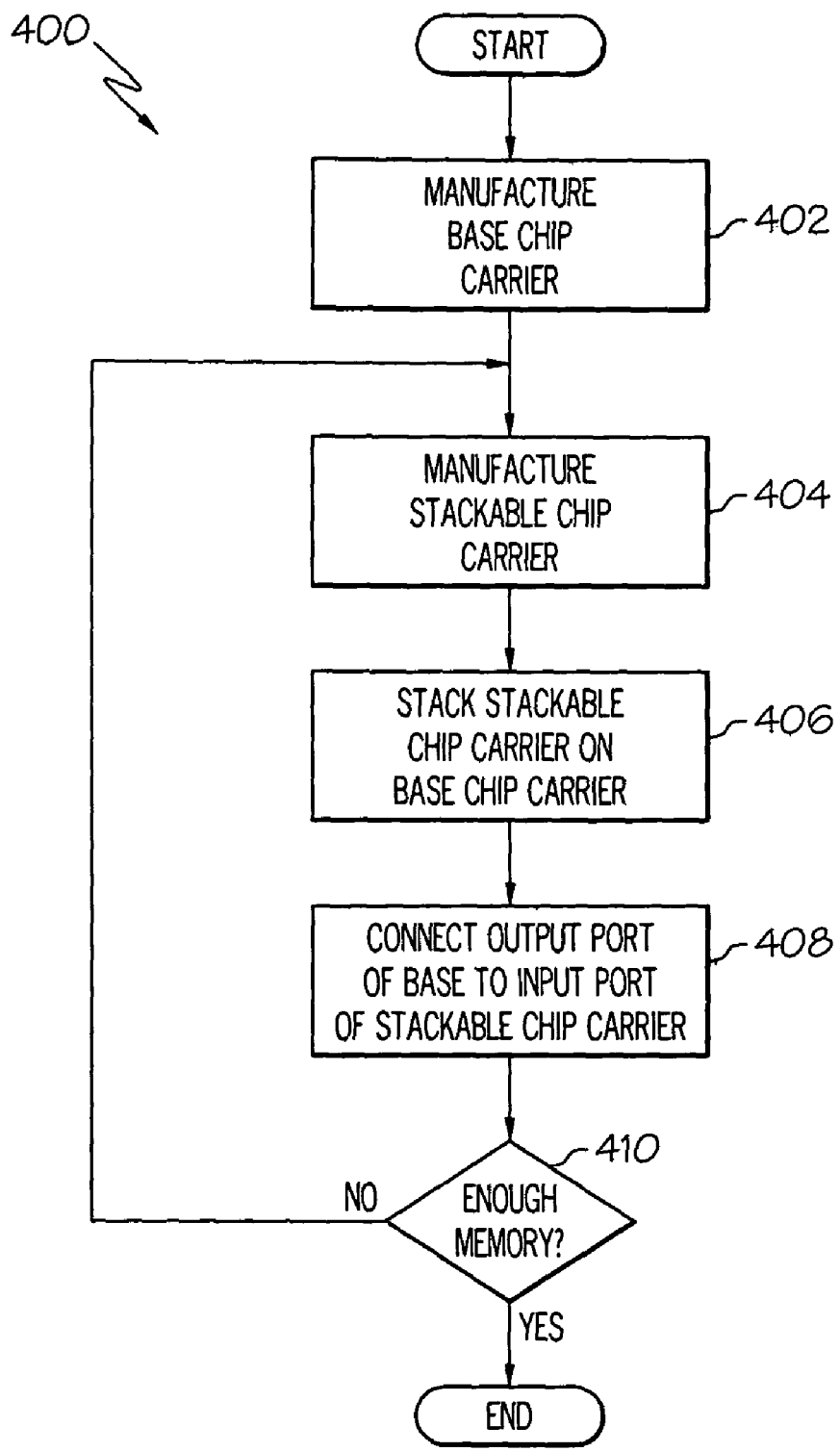
FIG. 4 depicts a flow diagram of a method for manufacturing stacked integrated circuit dies.

Referring to FIG. 4 a method 400 for manufacturing a stacked chip arrangement is depicted. As illustrated in block 402, a base chip carrier with primary and secondary read and write ports can be manufactured such that the primary read and write ports are in a first region of the chip carrier and that the secondary read and write ports are in a second region of the chip.

As illustrated in block 404, a stackable chip carrier with primary and secondary read and write ports can be manufactured such that the primary read and write ports are in a first region of the chip carrier and that the secondary read and write ports are in a second region of the chip carrier. The stackable chip carrier can also have a first side and a second side, wherein the first side has a four region electrode configuration and the second side of the stackable chip carrier has an electrode configuration that is a transposed version of the electrode configuration of the first side of the stackable chip.

The stackable chip carrier can be stacked on the base chip carrier as illustrated by block 406 such that an output port of the base package is proximate to an input port of the stackable package. As illustrated by block 408, the output port on the base package can be connected to the input port of the stackable package. In one embodiment, the chip carriers can be soldered together utilizing a fine ball grid array. As illustrated in decision block 410, it can be determined if the number of memory chips provide enough memory capacity. If the assembled memory chips provide enough memory capacity, then the process can end. If the memory chips do not provide enough memory capacity then another stackable memory chip with the interconnection described can be added to the previously stacked memory chip as the process reverts back to block 404.

The present disclosure and some of its features have been described in detail for some embodiments. It should be understood that various changes, substitutions and alterations can be made herein without departing from the spirit and scope of the disclosure as defined by the appended claims. An embodiment of the disclosure may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. An apparatus comprising;
a first integrated circuit die; and
a base chip carrier coupled to the first integrated circuit die, the base chip carrier configured to interface a circuit board on a first side and having a pad out on a second side disposed about a first axis and a second axis, the first axis being perpendicular to the second axis, to interconnect with a pad out of a second chip carrier with a second integrated circuit die, the second side comprising;
  a first region having a bus pad out with a first port configuration to transmit data from the first integrated die to the second integrated circuit die; and
  a second region having a bus pad out of a second port configuration to receive data transmitted by the second integrated circuit die, wherein the first integrated circuit die and the second integrated circuit die are functionally equivalent and the bus pad out of the second port is translated about the first axis from the bus pad out of the first port and rotated one hundred and eighty degrees from the bus pad out of the first port configuration such that busses for the first integrated circuit die and the second integrated circuit die can be fabricated perpendicular to the circuit board.

2. The apparatus of claim 1, further comprising:
a third region of the base chip carrier having a bus pad out of a third port configuration that is translated about the second axis from the bus pad out of the first port configuration; and
a fourth region of the base chip carrier having a bus pad out of a fourth port configuration that is a translated about the first axis and second axis from the bus pad out of the first port and rotated one hundred and eighty degrees from the bus pad out of the first port configuration such that busses with different functions can be interconnected between the base chip carrier and the second chip carrier via the bus pad out.

3. The apparatus of claim 2, wherein the first region interconnects a primary read port, the second region interconnects a primary write port, the third region interconnects a secondary write port and the fourth region interconnects a secondary read port.

4. The apparatus of claim 1, further comprising a third stackable chip carrier superimposed on the second chip carrier, the third stackable chip carrier having an electrode configuration that is substantially similar to the electrode configuration of the second chip carrier.

5. The apparatus of claim 1, wherein the second chip carrier comprises vias and traces to interconnect the first side of the second chip carrier to the second side of the second chip carrier.

6. A die mounting system comprising:

a first die mounting assembly having a first die and an electrode interconnect configuration divided into at least a first region supporting a first input-output (I/O) and a second region supporting a second I/O; and a second die mounting assembly having a second die that is functionally substantially similar to the first die, the second die mounting assembly stacked on the first die mounting assembly, the second die mounting assembly having a first side with an electrode interconnect configuration with a first region that supports a first I/O and a second region that supports a second I/O, and wherein the first I/O of the second die is functionally similar to the first I/O of the first die, and the second I/O of the first die is functionally similar to the second I/O of the second die under similar operating conditions, wherein the first I/O of the second die mounting assembly is disposed above the second I/O of the first die mounting assembly and a solder joint joins the first I/O of the first die mounting assembly to the second I/O of the second die mounting assembly.

* * * * *